United States Patent [19]
Yamashita

[11] Patent Number: 5,763,939
[45] Date of Patent: Jun. 9, 1998

[54] SEMICONDUCTOR DEVICE HAVING A PERFORATED BASE FILM SHEET

[75] Inventor: Chikara Yamashita, Tokyo, Japan

[73] Assignee: NEC Corporation, Tokyo, Japan

[21] Appl. No.: 529,341

[22] Filed: Sep. 18, 1995

[30] Foreign Application Priority Data

Sep. 30, 1994 [JP] Japan .................. 6-236985

[51] Int. Cl.⁶ .......................... H01L 23/495; H01L 23/02
[52] U.S. Cl. .................... 257/668; 257/686; 257/774
[58] Field of Search .................... 257/668, 686, 257/774

[56] References Cited

U.S. PATENT DOCUMENTS 5,045,914 9/1991 Casto et al. .................. 357/70
5,045,921 9/1991 Lin et al. .................. 357/74
5,291,062 3/1994 Higgins, III .................. 257/698

FOREIGN PATENT DOCUMENTS 6268101 9/1994 Japan.

OTHER PUBLICATIONS

Patent Abstract of Japan JP 56 134743 Oct. 21, 1981.

*Primary Examiner*—Tom Thomas
*Assistant Examiner*—David Ostrowski
*Attorney, Agent, or Firm*—Whitham, Curtis & Whitham

[57] ABSTRACT

In a semiconductor device which has a base film sheet to support a semiconductor chip in a center region of the base film sheet, a plurality of via holes are formed within a peripheral region of the base film sheet. The via holes may be used to mount a metal plate on the base film sheet or to support another semiconductor chip, by forming ball bumps on or in the via holes. A circuit board may be attached to the base film sheet by the use of the bumps or pins extended through the via holes.

12 Claims, 8 Drawing Sheets

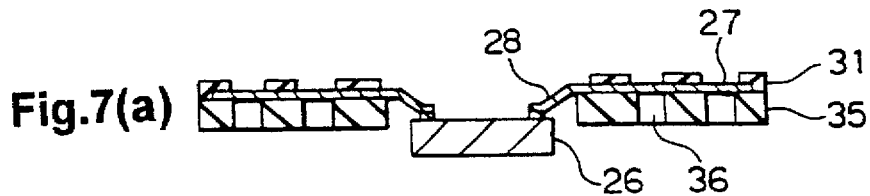
Fig.7(a)
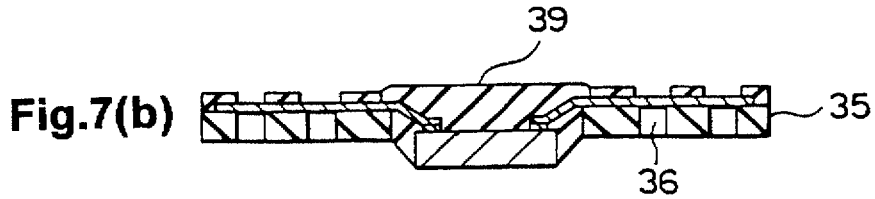
Fig.7(b)
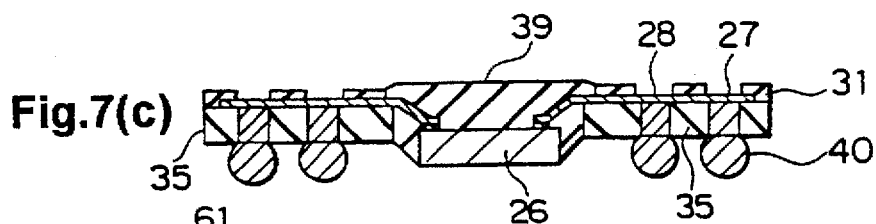
Fig.7(c)
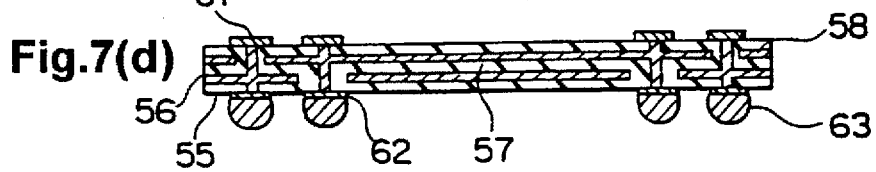
Fig.7(d)
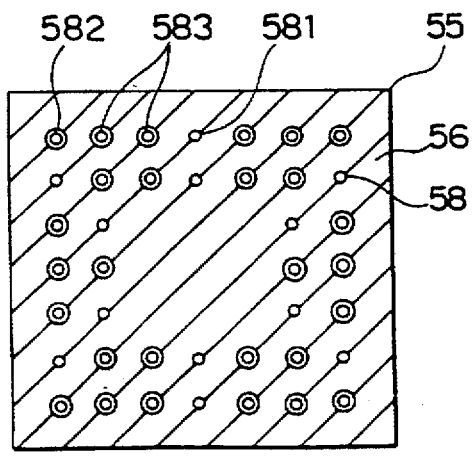
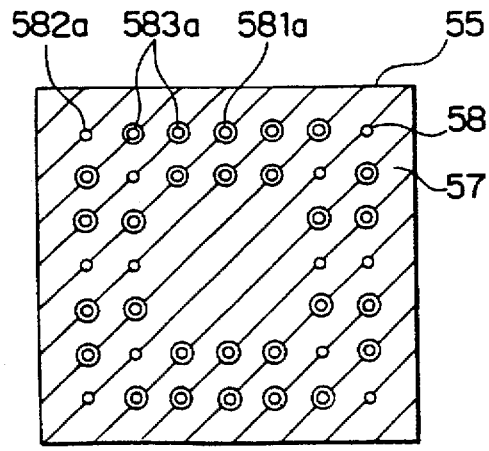
Fig.7(e)　　　　　　　　　　　　Fig.7(f)
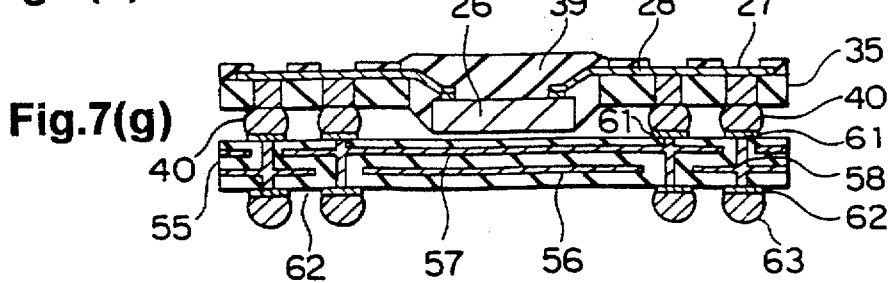
Fig.7(g)

SEMICONDUCTOR DEVICE HAVING A PERFORATED BASE FILM SHEET

BACKGROUND OF THE INVENTION

This invention relates to a semiconductor device which has a semiconductor chip mounted on a base film.

Heretofore, a semiconductor device of the type described has been proposed in Japanese Patent Application No. Hei 6-94881, namely, 94881/1994, which has not been published yet. Specifically, the semiconductor device includes an insulator film which may be called a base film and which has a center region and a peripheral region surrounding the center region. A semiconductor chip which has a great number of elements and a plurality of chip electrodes is located within an opening or a device hole formed in the center region and is resin-molded while a plurality of conductive pads are laid on the peripheral region and are electrically connected to the chip electrodes through inner leads. To the conductive pads, solder bumps are attached as outer connection electrode members and are projected from a surface of the base film.

With this structure, the solder bumps on the base film can be directly mounted onto a circuit board, such as a mother board with the solder bumps faced with the circuit board. Therefore, the base film substantially serves as a package member. Since the inner leads are laid only within the base film, the semiconductor device is small in size.

Moreover, the semiconductor device mentioned above is inexpensive in comparison with a semiconductor device which has a ceramic package, because the base film is substantially cheaper than the ceramic package.

Herein, it is to be noted that a front surface of the semiconductor chip is directed towards the circuit board while a back surface of the semiconductor chip is exposed to an atmosphere when the solder bumps are mounted on the circuit board. Therefore, the semiconductor device is disadvantageous in that the semiconductor chip is liable to be contaminated or polluted and that the elements in the semiconductor chip can not be electromagnetically shielded.

Furthermore, the elements in the semiconductor device are formed on a side of the front surface to which the solder bumps are attached. Thus, the elements face the circuit board with gaps which are defined by the solder bumps and which are left between the elements and the circuit board. This structure is not enough to radiate heat from the elements included in the semiconductor device.

In addition, the semiconductor device should be electrically tested by the use of a probe after it is mounted on the circuit board, so as to check whether or not the elements are normal. However, the above-mentioned semiconductor device can not be checked after it is mounted on the circuit board.

SUMMARY OF THE INVENTION

It is an object of this invention to provide a semiconductor device which can avoid contamination of elements after mounting the semiconductor device on a circuit board.

It is another object of this invention to provide a semiconductor device of the type described, which can effectively radiate heat from the elements.

It is still another object of this invention to provide a semiconductor device of the type described, which is capable of readily checking the elements after mounting the semiconductor device on the circuit board.

It is yet another object of this invention to provide a semiconductor device of the type described, which can be readily bonded onto the circuit board.

According to an aspect of this invention, a semiconductor device comprises a base film sheet which has a center region, a peripheral region surrounding the center region, and a plurality of via holes bored on the peripheral region, a semiconductor chip attached to the base film sheet, an electric connection member which is laid on the peripheral region to be electrically connected to the semiconductor chip, and an outer electrode member which has a portion positioned at the via holes and which is electrically connected to the electric connection member. In this event, the base film sheet has a device hole on the center region while the semiconductor chip is located within the device hole.

A metal plate member may be attached to the base film sheet and may comprise a metal plate having a plate surface and a plurality of second bumps attached to the plate surface faced with the via holes of the base film sheet to be electrically connected to the first bumps through the via holes.

According to another aspect of this invention, a semiconductor device comprises a plurality of semiconductor units stacked relative to each other to be electrically connected to one another and a metal plate member brought into contact with an uppermost one of the semiconductor units.

According to a further aspect of this invention, a semiconductor comprises a base film sheet which has a center region, a peripheral region surrounding the center region, and at least one via hole bored on the peripheral region, a semiconductor chip attached to the base film sheet, an electric connection member which is laid on the peripheral region to be electrically connected to the semiconductor chip, an outer electrode member which has a portion positioned at the at least one via hole and which is electrically connected to the electric connection member, and a circuit board member attached to the outer connection member.

BRIEF DESCRIPTION OF THE DRAWING

FIGS. 7(a) to (g) are views for use in describing a semiconductor device according to a fifth embodiment of this invention;

DESCRIPTION OF THE PREFERRED EMBODIMENTS

Figure 1:
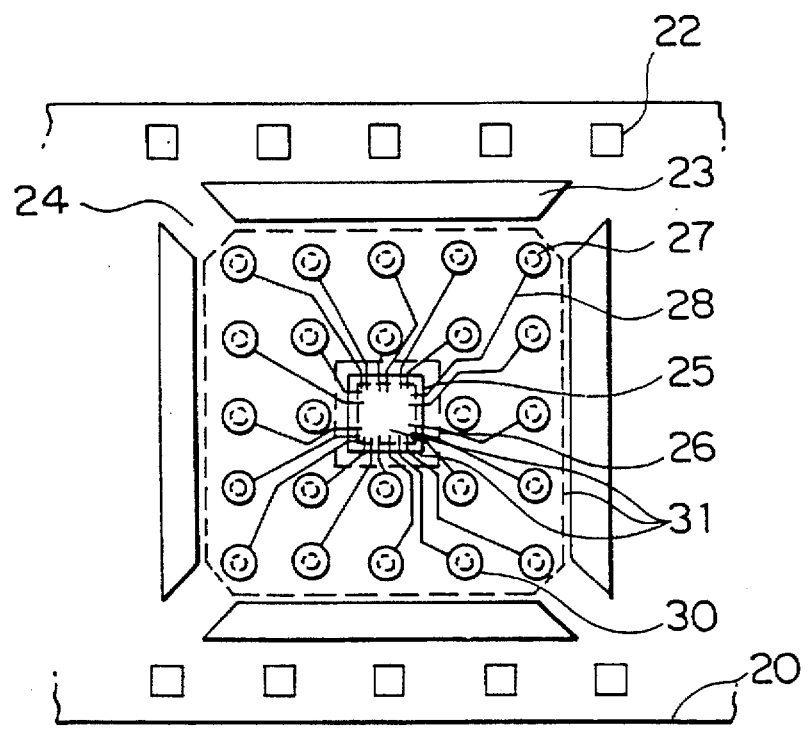
FIG. 1 is a plan view of a conventional semiconductor device.

Referring to FIG. 1, a conventional semiconductor device is substantially equivalent to that described in the preamble of the instant specification and is fabricated by the use of an insulator film 20 of, for example, polyimide which will be called a base film. As shown in FIG. 1, the base film 20 is given in the form of a tape which has a length along a length direction between a lefthand side of FIG. 1 and a righthand side, together with a width along a width direction transverse to the length direction. Two lines of sprocket holes 22 are opened on the tape along the length direction with a spacing in the width direction between the two lines of the sprocket holes while each line of the sprocket holes is spaced at a predetermined interval along the length direction. By the use of the sprocket holes, the tape can be transported along the length direction by a transportation mechanism (not shown) and positioned at a preselected position.

In addition, four cut holes 23 each of which has a trapezoidal configuration are bored within a zone interposed between the two lines of the sprocket holes 22 and surrounds a partial zone of a square shape. As illustrated in FIG. 1, two adjacent ones of the four cut holes 23 are separated from each other by bridge portions 24 of the tape.

Now, the partial zone of the tape or the base film 20 has a center region and a peripheral region surrounding the center region. In the illustrated example, a device hole 25 is formed in the center region while the peripheral region forms a partitioned section.

Within the device hole 25, a semiconductor chip 26 is located which has a great number of elements and chip electrodes connected to the elements, as is well known in the art. On the other hand, a plurality of electrode pads 27 are arranged on the peripheral region of the base film 20 and are electrically connected to the chip electrodes through inner leads 28. Thus, the inner leads 28 are connected to both the electrode pads 27 and the chip electrodes. Ball bumps 30 are attached onto the electrode pads 27 and projected from the electrode pads 27 in an upward direction of the paper. The ball bumps 30 may be formed by solder and therefore may be called solder bumps.

In addition, the peripheral region of the base film 20 is covered with a cover resist film 31 to avoid contamination of the inner leads 28 with the ball bumps 30 uncovered. The semiconductor chip 26 is assumed to be resin-molded together with the inner leads 28 adjacent to the semiconductor chip 26.

Finally, the semiconductor device which includes the semiconductor chip 26 and the base film 20 is completed by cutting the bridge portions 24 of the base film 20 and by separating the peripheral region from the base film 20. A combination of the ball bumps 30 and the base film 20 with the semiconductor chip 26 will be called a base film member.

The semiconductor device has shortcomings as pointed out in the preamble of the instant specification.

Figure 2A:
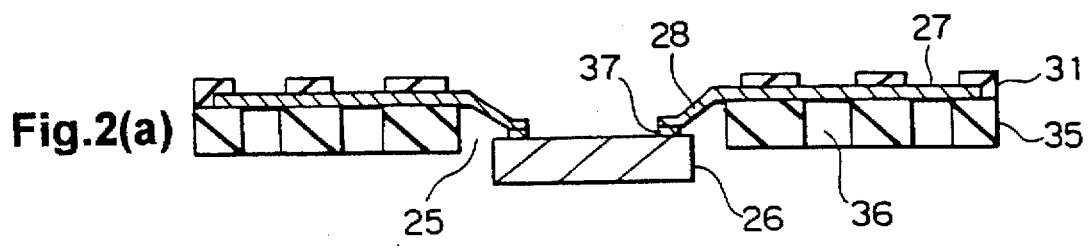
FIGS. 2(a) to (f) are sectional views for use in describing a semiconductor device according to a first embodiment of this invention in the order of manufacturing processes.

Referring to FIGS. 2(a) to 2(f), a semiconductor device according to a first embodiment of this invention will be successively described in the order of manufacturing processes. In FIG. 2(a), a semiconductor chip 26 is first prepared along with a base film sheet depicted at 35. The semiconductor chip 26 may be similar to that illustrated in FIG. 1 and has front and back chip surfaces directed upwards and downwards of FIG. 1(a), respectively.

The base film sheet 35 is composed of an insulator material, namely, a nonconductive material, such as a polyimide resin. Like in FIG. 1, the base film sheet 35 has a partitioned section or the partial zone which is defined by cut holes (not shown in FIG. 2) and which has a center region and a peripheral region surrounding the center region. A device hole 25 is bored in the center region and encompassed by the peripheral region.

Herein, it is to be noted that the illustrated peripheral region has first and second sheet surfaces directed upwards and downwards of FIG. 2 and a plurality of via holes 36 bored in the base film sheet 35 and contiguous to the first and the second sheet surfaces. Such formation of the via holes 36 is different from that illustrated in FIG. 1. Such a base film sheet 35 may be called a perforated base film sheet.

As shown in FIG. 2(a), a plurality of inner leads 28 are laid on the first sheet surface of the base film sheet 35 and are extended from the peripheral region of the base film sheet 35 inside of the device hole 25. Each of the inner leads 28 has an inside end positioned within the device hole 25 and an outside end placed on the first sheet surface of the peripheral region.

An electrode pad, namely, a land 27 is formed on the outside end of each inner lead 28 which is located on the via hole 36. A cover resist film 31 is coated on the first sheet surface of the base film sheet 35 except for the land or pad 27. In other words, the electrode pads or lands 27 are uncovered with the cover resist film 31.

On the other hand, the inside end of each inner lead 28 is bonded onto the chip electrodes (depicted at 37) of the semiconductor chip 26 and is therefore electrically connected to the semiconductor chip 26 on the front chip surface.

Figure 2B:
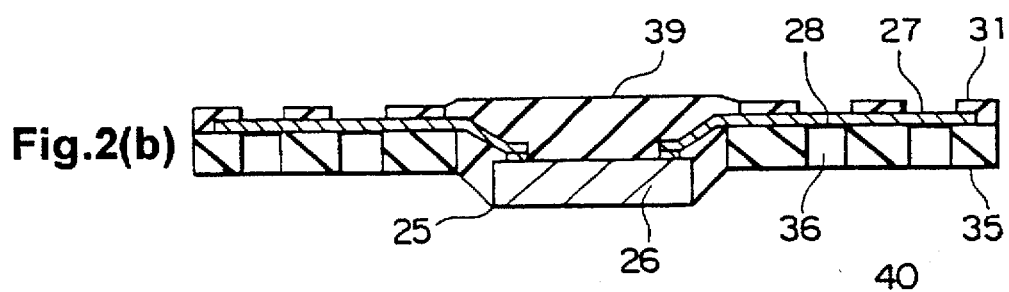

As shown in FIG. 2(b), the semiconductor chip 26 is molded on a side of the front chip surface together with the inner leads 28 extended within the device hole 25 by a resin mold 39. Thus, the front chip surface of the semiconductor chip 26 is covered with the resin mold 39 along with bonded portions of the inner leads 28 while the back chip surface of the semiconductor chip 26 is uncovered with the resin mold 39, as illustrated in FIG. 2(b). In addition, the lands 27 are also uncovered with the cover resist film 31 and are exposed to an atmosphere.

Figure 2C:
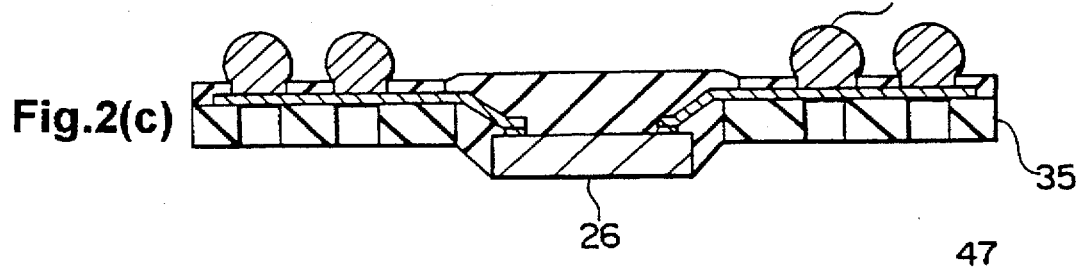

On the uncovered lands 27, ball shaped bumps 41 are formed which are projected upwards of FIG. 2(c) and which may be called first bumps 40. The first bumps 40 may be, for example, solder and serve as outer connection electrode members. Thus, a base film member is obtained which includes the base film sheet 35, the semiconductor chip 26, and the first bumps 40.

Figure 2D:

In the illustrated example, provision is made for a metal plate member, as shown in FIG. 2(d). The metal plate member comprises a metal plate 45 which has a first plate surface directed upwards of FIG. 2(d) and a second plate surface directed downwards. In addition, the metal plate 45 is assumed to have a similar size to the base film sheet 35 and has a center opening in a center area and a peripheral area surrounding the center opening. The center opening of the metal plate 45 may be identical with the device hole 25 of the base film sheet 35 and can surround the semiconductor chip 26 like the base film sheet 35. Therefore, the illustrated metal plate 45 can completely cover the base film sheet 35.

On the first plate surface, second bumps 47 are formed at positions which correspond to the via holes 36 on the base film sheet 35. The second bumps 47 are composed of solder, like the first bumps 40 and are projected onto the first plate surface upwards of FIG. 2(d). The remaining one of the first plate surface is covered with a solder resist film 48.

Figure 2E:
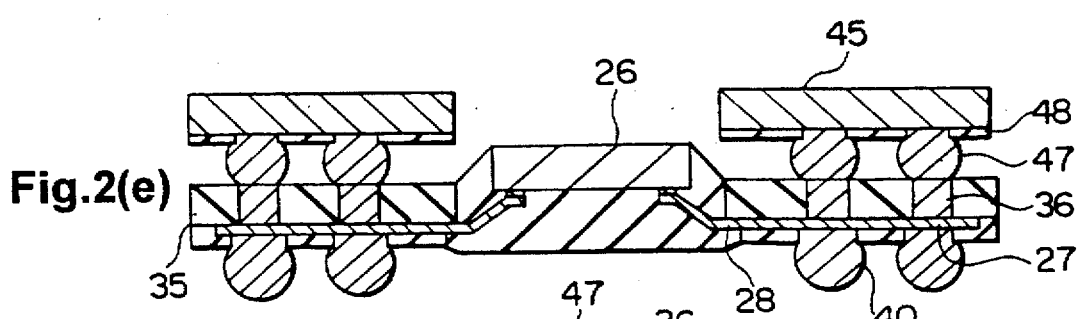

In FIG. 2(e), the base film member (shown in FIG. 2(c)) and the metal plate member (shown in FIG. 2(d)) are reversed so that the second bumps 47 on the metal plate 45 face with the via holes 36 on the base film sheet 35. As a result, the front chip surface of the semiconductor chip 26 is directed downwards of FIG. 2(e) while the back chip surface is directed upwards. Likewise, the first and the second plate surfaces of the metal plate 45 are directed downwards and upwards of FIG. 2(e), respectively.

Thereafter, the second bumps 47 are brought into contact with the via holes 36 on the base film sheet 35 and softened by a heat treatment. Consequently, the second bumps 47 are caused to partially flow into the corresponding via holes 36 and are electrically connected to the inner leads 28 through the via holes 36. Thus, it is possible to obtain a semiconductor device which has the first and the second bumps 40 and 47 projected from both the first and the second sheet surfaces of the base film sheet 35. Such bumps 40 and 47 may be called protrusions or projections.

Figure 2F:
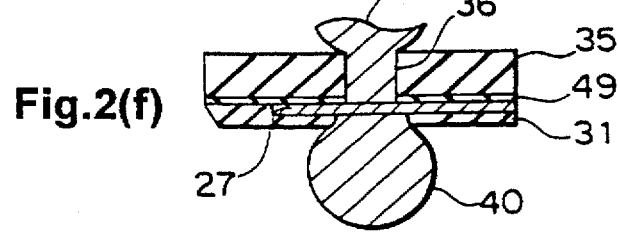

In FIG. 2(f), a connection between the first and the second bumps 40 and 47 is illustrated in detail. Specifically, the base film sheet 35 is covered with an adhesive film 49 on the side of the first bumps 40, as shown in FIG. 2(f). In addition, the land 27 is formed on the adhesive film 49 and contacts with the first and the second bumps 40 and 47.

Figure 3A:
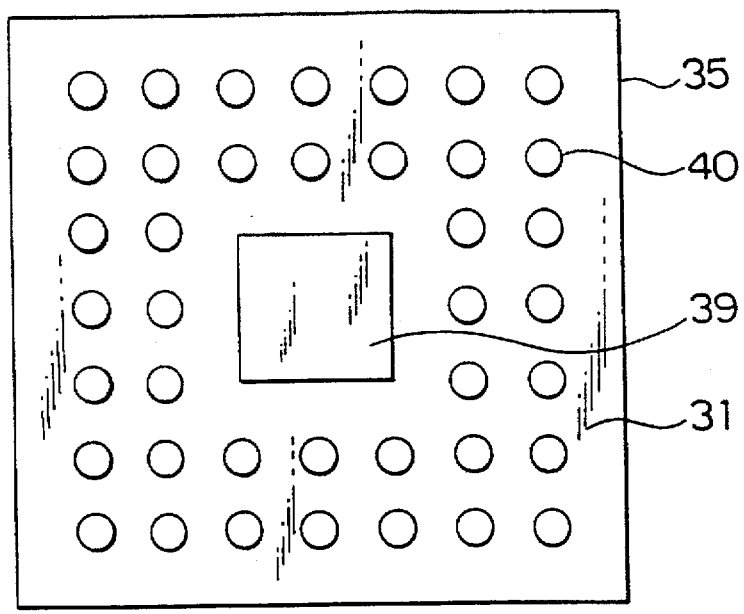
FIGS. 3(a) and (b) are plan views for describing portions of the semiconductor device illustrated in FIGS. 2(a) to (f)

Referring to FIGS. 3(a) and (b), the semiconductor device illustrated in FIG. 2(e) is seen from the sides of the first bumps 40 and the metal plate 45, respectively. As shown in FIG. 3(a), the first bumps 40 are arranged in a matrix manner on the peripheral region of the base film sheet 35 around the semiconductor chip 26 molded by the resin mold 39. The first bumps 40 are connected to the inner leads 28, as shown in FIG. 2(e) and are encompassed by the cover resist film 31, as illustrated in FIG. 3(a). In addition, the first chip surface of the semiconductor chip 26 is covered with the resin mold 39, as is apparent from FIG. 3(a).

Figure 3B:
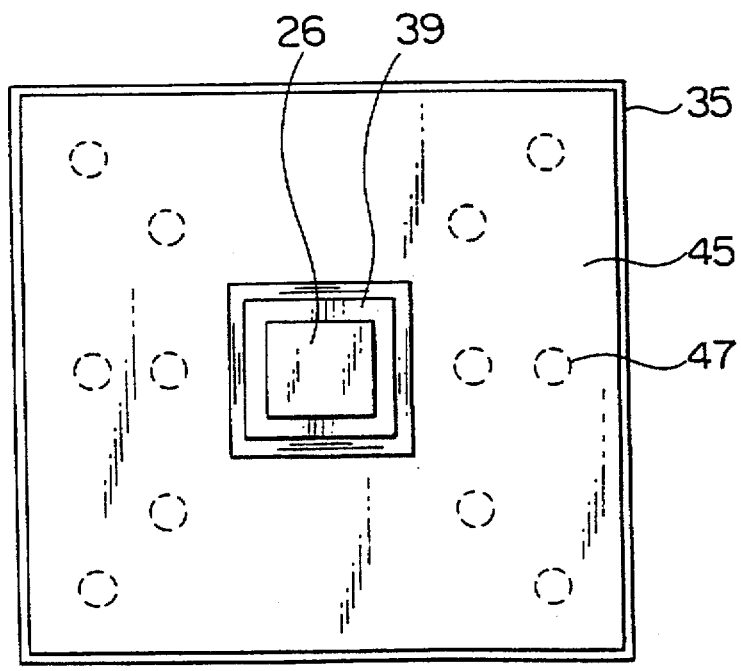

On the other hand, the back chip surface of the semiconductor chip 26 is exposed on the side of the metal plate 45 without being covered with the resin mold 39 and the metal plate 45, as shown in FIG. 3(b).

Thus, the semiconductor chip 26 molded is surrounded by the metal plate 45. The second bumps 47 are extended downwards of FIG. 3(b), as symbolized by broken line circles, and are small in number in comparison with the first bumps 40 shown in FIG. 3(a). This shows that the second bumps 47 are electrically connected only to a restricted number of the inner leads 28 and serve to supply the same potential to the restricted number of the inner leads 28. In other words, the metal plate 45 is operable to give a ground potential or a predetermined source potential to the restricted number of the inner leads 28.

With this structure, it is possible to reduce a resistance or an inductance of a power supply circuit to ⅕–⅒, by impressing the ground potential or the predetermined source potential, for example, Vcc onto the metal plate 45.

Attachment of the metal plate 45 to the base film sheet 35 serves to electromagnetically shield the first bumps 40. Therefore, the semiconductor device is rarely influenced by an external noise. Moreover, the base film sheet 35 has the via holes 36, which is useful to reduce a warp or a bend in the base film sheet 35.

Figure 4A:
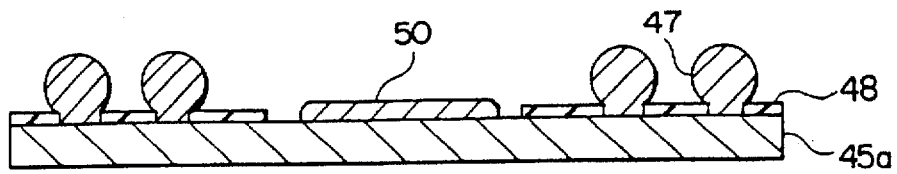
FIGS. 4(a) and (b) are sectional views for describing a semiconductor device according to a second embodiment of this invention.

Referring to FIGS. 4(a) and (b), a semiconductor device according to a second embodiment of this invention comprises a metal plate 45a (FIG. 4(a)) which is different from that illustrated in FIGS. 2 and 3. More specifically, the illustrated metal plate 45a has no opening in the center area thereof. Instead, a solder portion 50 of silver paste is located at the center area of the metal plate 45a. In addition, the cover resist film 48 is coated on the peripheral area of the metal plate 45a with the lands for the second bumps 47 left uncovered, like in FIG. 2.

Figure 4B:
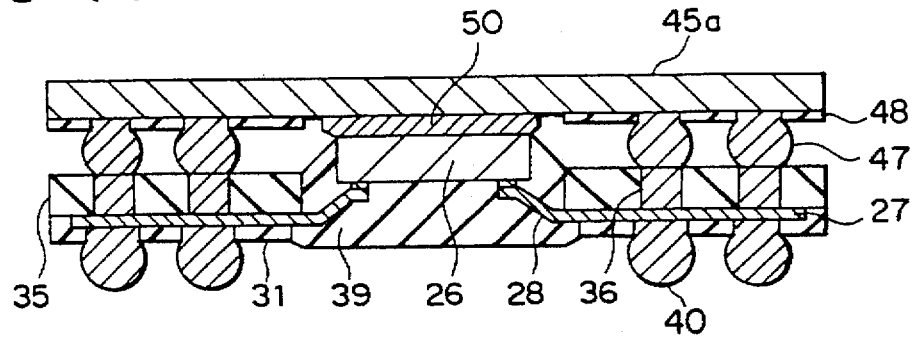

As shown in FIG. 4(b), the metal plate 45a illustrated in FIG. 4(a) is mounted on the base film member with the second bumps 46 directed downwards. Like in FIG. 2(c), the base film member has the via holes 36 and the semiconductor chip 26 attached to the base film sheet 35.

Thus, the base film member has a perforated base film sheet 35 and the second bumps 47 are placed at positions which correspond to the via holes 36 of the base film sheet 35. On the other hand, the solder portion 50 is brought into contact with the back chip surface of the semiconductor chip 26, as illustrated in FIG. 4(b).

Under the circumstances, the second bumps 47 and the solder portion 50 are subjected to a heat treatment to be softened or molten. The resultant second bumps 47 are caused to partially flow into the via holes 36 to be electrically connected to the lands 27 of the inner leads 28 while the resultant solder portion 50 mechanically connects the metal plate 45a to the semiconductor chip 26. Thus, the metal plate 45a is mechanically fixed to the semiconductor chip 26.

With this structure, the metal plate 45a acts as a heat spreader for radiating heat from the semiconductor chip 26 because the metal plate 45a is directly contacted with the semiconductor chip 26. In addition, the metal plate 45a also serves as a shield plate like in FIGS. 2 and 3 because elements in the semiconductor chip 26 can be electromagnetically shielded by the metal plate 45a.

Furthermore, the second bumps 47 may be connected to a predetermined or restricted number of the inner leads 28 when the metal plate 45a is given a predetermined potential, as mentioned in conjunction with FIGS. 2 and 3. Alternatively, the metal plate 45a may not always be electrically connected to the inner leads 28 when it is used only as the heat spreader.

As illustrated in FIG. 4(b), the first and the second bumps 40 and 47 are projected from both sheet surfaces of the base film sheet 35, like in FIG. 2.

Figure 5:
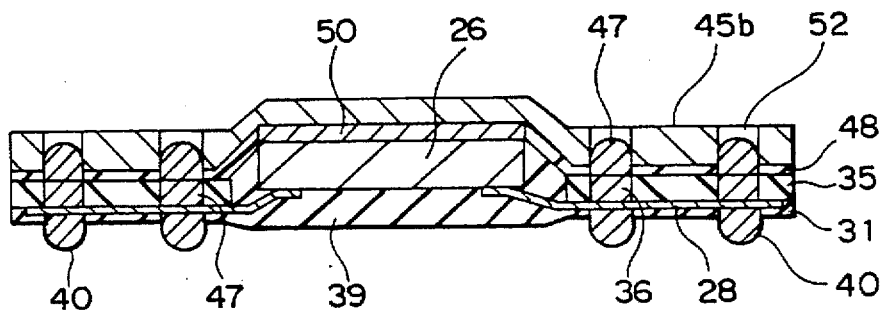
FIG. 5 is a sectional view of a semiconductor device according to a third embodiment of this invention.

Referring to FIG. 5, a semiconductor device according to a third embodiment of this invention is similar to that illustrated in FIGS. 4(a) and (b) except that a metal plate 45b has a plurality of through holes 52 which correspond to the via holes 36 formed in the base film sheet 35. The metal plate 45b lends itself to a heat spreader like the metal plate 45a shown in FIGS. 4(a) and (b).

The illustrated semiconductor device can be manufactured by preparing the base film sheet 35 which has the via holes 36 and the first and the second sheet surfaces directed downwards and upwards of FIG. 5, respectively, and by projecting the first and the second bumps 40 and 47 from the first and the second sheet surfaces of the base film sheet 35, respectively. In this case, the first and the second bumps 40 and 47 are composed of solder and electrically connected to each other within each of the via holes 36.

As shown in FIG. 5, the second bumps 47 are partially introduced into the through holes 52 formed within the metal plate 45b. In this case, tops of the second bumps 47 can be seen on an upper side of FIG. 5 and can be contacted by the use of an electric testing probe (not shown). This means that the illustrated semiconductor device can be checked even after the semiconductor device is mounted on a circuit board (not shown). Incidentally, the first and the second bumps 40 and 47 are formed on an area which is uncovered with a cover resist film 31, like in the other figures.

Figure 6:
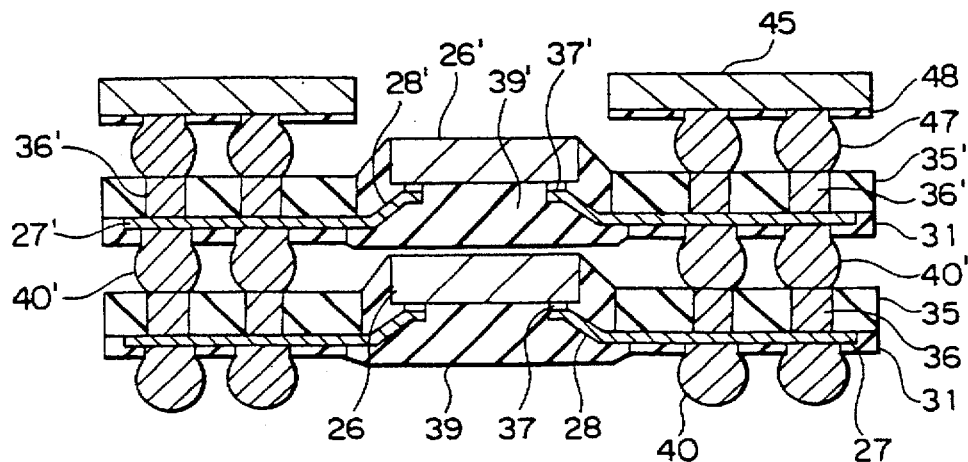
FIG. 6 is a sectional view of a semiconductor device according to a fourth embodiment of this invention.

Referring to FIG. 6, a semiconductor device according to a fourth embodiment of this invention has a structure similar to that illustrated in FIGS. 2(a) to (f) in view of the fact that two semiconductor devices as shown in FIGS. 2(a) to (f) are stacked in a thickness direction of semiconductor chips 26 and 26'. Accordingly, similar reference numerals will be attached to the corresponding portions and elements for a better understanding of this invention. In this case, the two semiconductor devices are similar in structure to each other and will be called first and second semiconductor units hereinafter.

More particularly, the first semiconductor unit includes the base film sheet 35 having the via holes 36, the semiconductor chip 26 molded by the resin mold 39, and the inner leads 28 connected to the chip electrodes 37 and the lands 27 formed on the base film sheet 35. In the first semiconductor unit, bumps 40 are mounted on the lands 27 as first unit bumps and projected from the lands 27 downwards of FIG. 6.

On the via holes 36 of the base film sheet 35, bumps 40' are located and may be called second unit bumps. The second unit bumps 40' are electrically connected to the first unit bumps 40 through the via holes 36 bored within the base film sheet 35 of the first semiconductor unit.

As is apparent from FIG. 6, the second semiconductor unit includes, together with the second unit bumps 40', the base film sheet 35' having the via holes 36', the semiconductor chip 26' molded by the resin mold 39', and the inner lands 28'. The second unit bumps 40' are directed downwards of FIG. 6 and are connected to the first unit bumps 40 through the via holes 36 formed within the base film sheet 35, as mentioned before.

The via holes 36' of the second semiconductor unit are located at positions from which the second unit bumps 40' are projected. In this event, all of the via holes 36' may not be located at the positions of the second unit bumps 40', although not shown in FIG. 6.

In the illustrated example, a metal plate member is mounted on the second semiconductor unit and is similar in structure to that illustrated in FIG. 2(d). Specifically, the metal plate member includes the metal plate 45 and the bumps 47 surrounded by the cover resist film 48. The bumps 47 are electrically connected to the bumps 40' of the second semiconductor unit through the via holes 36' formed within the base film sheet 35'.

With this structure, an electric potential can be given to the inner leads 28 and 28' electrically connected to the bumps 47, 40', and 40. In addition, stacking a plurality of the semiconductor units, as shown in FIG. 6, is very helpful to increase a packaging density.

Referring to FIGS. 7(a) to (g), a semiconductor device according to a fifth embodiment of this invention is manufactured through processes illustrated in FIGS. 7(a) through (d). In FIG. 7(a), a base film sheet 35 is prepared which has upper and lower surfaces, a plurality of via holes 36 and a device hole 25, like in FIG. 2. Inner leads 28 are laid on an upper surface of the base film sheet 35 and are electrically connected to chip electrodes of a semiconductor chip 26 and lands 27 formed on the via holes 36. Thus, the semiconductor chip 26 is fixed to the base film sheet 35 by the inner leads 28. A cover resist film 31 is formed on the upper surface of the base film sheet 35 with the lands 27 uncovered.

The semiconductor chip 26 is molded by a resin mold 39 on the front chip surface directed upwards of FIG. 7(b). As illustrated in FIG. 7(b), the resin mold 39 covers the front chip surface of the semiconductor chip 26 but does not cover the back chip surface.

As shown in FIG. 7(c), bumps 40 which may be called first bumps are projected from the lower surface of the base film sheet 35 downwards and are electrically connected to the lands 27 formed on the upper surface of the base film sheet 35. Thus, the first bumps 35 illustrated in FIG. 7(c) have portions buried into the via holes 36 and portions projected from the base film sheet 35. The illustrated lands 27 are uncovered with the cover resist film 31 and are therefore exposed to an atmosphere.

Furthermore, a circuit board 55 which may be formed by ceramics, glass epoxy, is prepared as shown in FIG. 7(d). The illustrated circuit board 55 is formed by a multilayer printed circuit board which includes a source layer 56 and a ground layer 57 wired within the board 55. The source layer 56 is electrically connected to first specific lands 61 placed on both upper and lower board surfaces of the circuit board 55 while the ground layer 57 is electrically connected to second specific lands 62 placed on both surfaces of the circuit board 55. The upper and the lower board surfaces may be referred to as first and second board surfaces, respectively. To the lands formed on the lower board surface of the circuit board 55, ball bumps 63 of, for example, solder are attached as external connection electrode members and may be referred to as second bumps, like in the other embodiments.

It is to be noted here that the first bumps 40 on the base film sheet 35 include bumps for an electric source, bumps for ground, and bumps for transferring information signals. In this event, the bumps for the electric source and the bumps for the ground can use the source and the ground layers 56 and 57 in common, respectively. Therefore, the second bumps 63 projected from the circuit board 55 may be reduced in number as compared with the first bumps 40 projected from the base film sheet 35.

Referring to FIGS. 7(e) and (f), the source layer 56 and the ground layer 57 in the circuit board 55 will be described in detail. In FIG. 7(e), the source layer 56 has a plurality of via holes as collectively depicted at 58. The via holes 58 include via holes 581, 582, and 583 for the electric source, the ground, and the information signals, respectively. Among the via holes 58, the via holes 581 for the electric source are electrically connected to the source layer 56, as shown by single circles, while the remaining via holes 582 and 583 for the ground and the information signals are electrically isolated from the source layer 56. Specifically, the source layer 56, as shown by double circles.

Herein, the via holes 581 are electrically connected to the bumps 40 for the electric source while the via holes 582 and 583 are electrically connected to the bumps 40 for the ground and the information signals. Under the circumstances, the source layer 56 is electrically connected only to the bumps 40 for the electric source and is disconnected from the bumps 40 for the ground and the information signals.

In FIG. 7(f), the ground layer 57 has also via holes 581a, 582a, and 583a for the electric source, the ground, and the information signals. The via holes 582a for the ground are electrically connected to the ground layer 57 while the remaining via holes 581a and 583a are isolated from the ground layer 57, as readily understood from FIG. 7(f).

Referring to FIG. 7(g), the base film member illustrated in FIG. 7(c) is mounted on the circuit board 55 shown in FIG. 7(d). In this event, the base film member is positioned on the circuit board 55 so that the first bumps 40 are brought into contact with the lands 61 of the circuit board 55. Thus, the first bumps 40 of the base film member are electrically connected to the second bumps 63 on the circuit board 55.

In the example illustrated in FIGS. 7(a) through (g), the lands 27 on the base film sheet 35 are exposed to an atmosphere and may be therefore visibly observed and contacted by a bonding tool or an electric testing probe. Therefore, the illustrated semiconductor device can be bonded by the bonding tool onto any other circuit board or tested by the testing probe after it is bonded.

In addition, ground and source electrodes formed by the bumps 40 are unified into single ground and source layers 57 and 56, respectively, in the circuit board 55 placed under the base film member. This structure makes it possible to reduce resistance and inductance values of the ground and the source electrodes by 30%–50%. Moreover, the circuit board 55 serves as a heat spreader and can reduce a thermal resistance to 10° C./W. Like in the other embodiments, it is possible to avoid the warp of the base film sheet 35 because the via holes 40 are bored in the base film sheet 35.

Figure 8A:
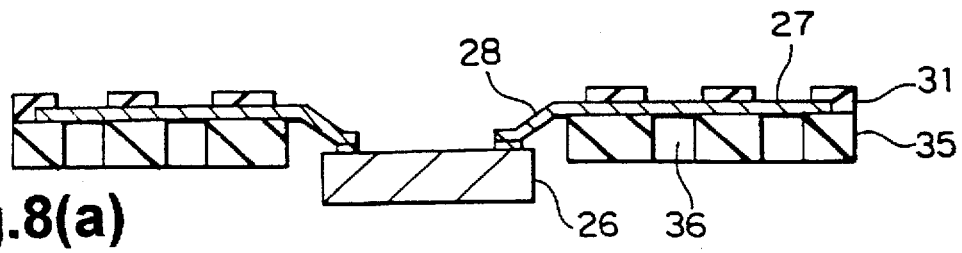
FIGS. 8(a) to (e) are views for use in describing a semiconductor device according to a sixth embodiment of this invention.
Figure 8B:
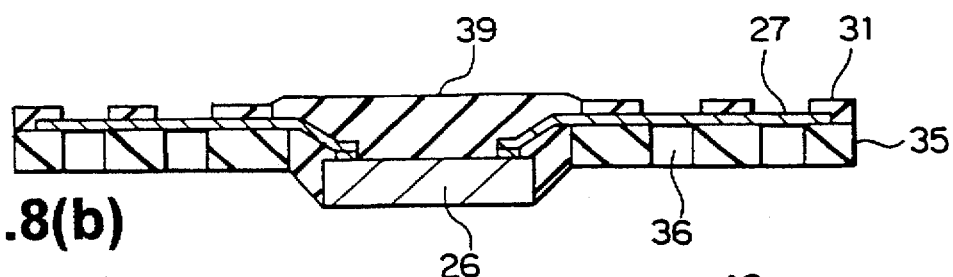

Referring to FIGS. 8(a) to (e), a semiconductor device according to a sixth embodiment of this invention will be described in the order of manufacturing processes. In FIGS. 8(a) and (b), the semiconductor chip 26 is attached to the inner leads 28 extended into the device hole 25 of the base film sheet 35 and is molded by the resin mold 39, like in FIGS. 7(a) and (b). It is needless to say that the illustrated base film sheet 35 also has the via holes 36 bored within the peripheral region thereof and the lands 27 which are formed at the ends of the inner leads 28 and which are uncovered with the cover resist film 31, as already described in conjunction with the other embodiments.

Figure 8C:
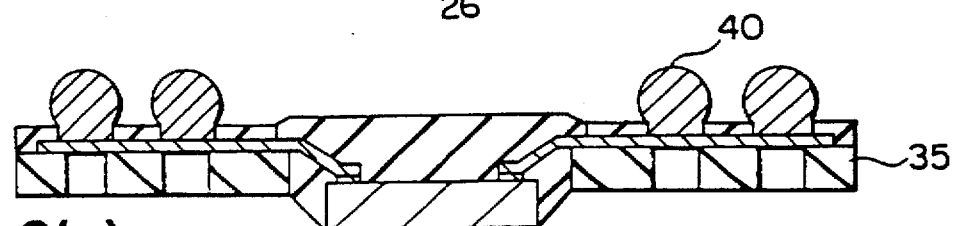

Herein, it is noted in FIG. 8(c) that the base film sheet 35 has the front sheet surface and the back sheet surface directed upwards and downwards of FIG. 8(c), respectively, and first bumps 40 projected from the lands 27 of the front sheet surface in an upper direction of FIG. 7(c). As a result, the first bumps 40 are projected in the direction different from that illustrated in FIG. 7(c). In this connection, the via holes 36 are not filled with the first bumps 40 and the lands 27 can be viewed through the via holes 36. Thus, a base film member is obtained which is somewhat different from that shown in FIG. 7(c).

Figure 8D:
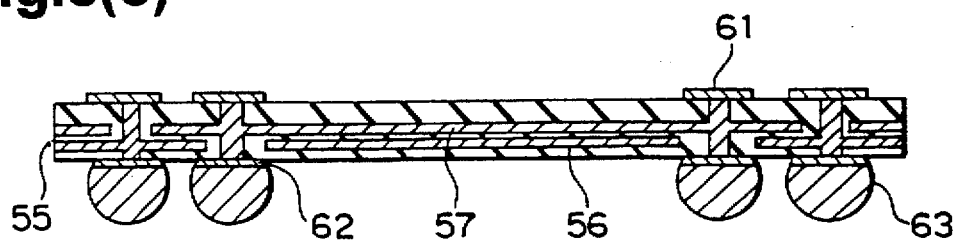

In FIG. 8(d), a circuit board 55 is prepared which is similar in structure to that illustrated in FIG. 7(d). Specifically, the circuit board 55 has the source layer 56 and the ground layer 57 therein and the lands 61 and 62 formed on both board surfaces of the circuit board 55 and electrically connected to the source and the ground layers 56 and 57. On the lands 62 directed downwards of FIG. 8(d), board bumps 63 are formed to mount the circuit board 55 onto a mother board or similar devices and may be called second bumps.

Figure 8E:
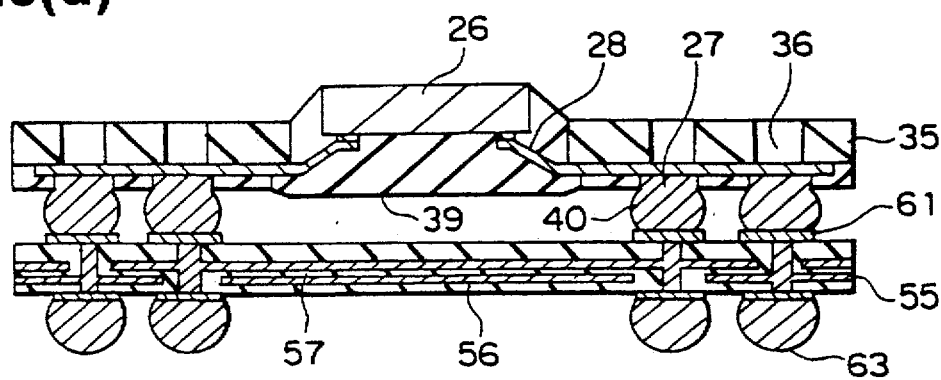

As shown in FIG. 8(e), the base film member illustrated in FIG. 8(c) is arranged so that the first bumps 40 are faced with the lands 61 of the circuit board 55. Thereafter, the base film member and the circuit board 55 are adjusted to each other to locate the first bumps 40 on the lands 61 of the circuit board 55. Under the circumstances, the first bumps 40 are softened by a heat treatment to be fixed to the lands 61. Thus, the base film member is mounted on the circuit board 55 and the semiconductor device is completed.

With this structure, the back chip surface of the semiconductor chip 26 and the via holes 36 are exposed to an atmosphere without being covered. Consequently, the lands 27 can be visibly observed through the via holes 36 and can be directly touched with the electric testing probe or the like. Therefore, each of the inner leads 28 can be electrically tested through the via holes 36 even after the base film member is mounted on the circuit board 55 or after the circuit board 55 is mounted on the mother board.

Figure 9A:
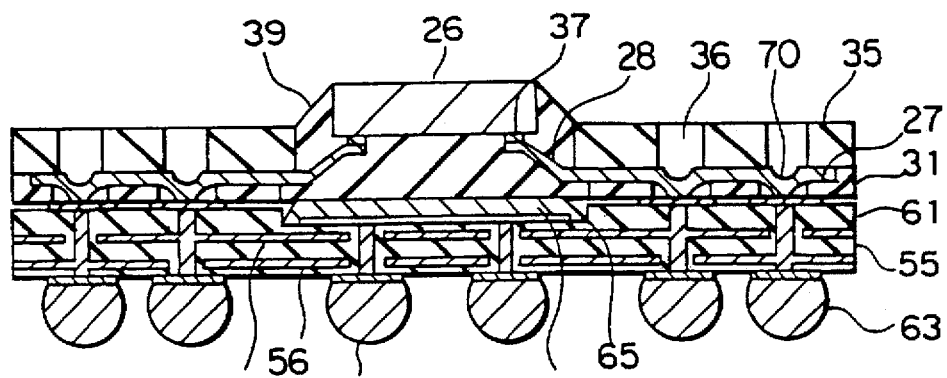
FIGS. 9(a) to (c) are views for use in describing a semiconductor device according to a seventh embodiment of this invention.
Figure 9B:
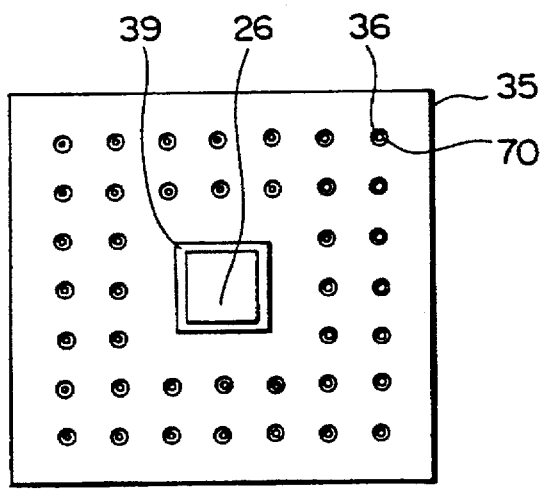
Figure 9C:
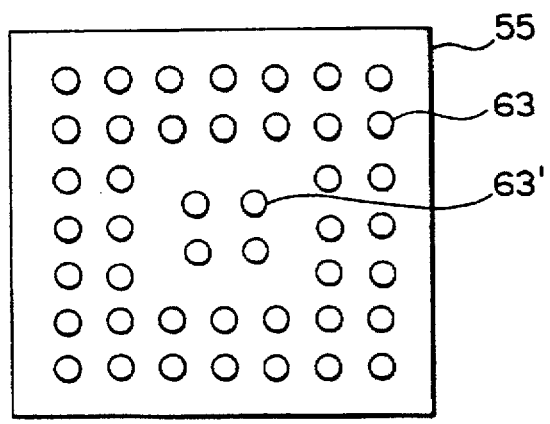

Referring to FIGS. 9(a) to (c), a semiconductor device according to a seventh embodiment of this invention is similar in structure to that illustrated in FIG. 8 except that the first bumps 40 in FIG. 8 are eliminated from FIG. 9 and that the circuit board 55 illustrated in FIG. 9(a) has a recessed portion, namely, a cavity portion 65 at the center region thereof and a silver paste 66 filled in the cavity portion.

More specifically, the lands 61 are formed on an upper board surface of the circuit board 55 while the semiconductor chip 26 is located within the device hole of the base film sheet 35 and is molded by the resin mold 39 with the front chip surface of the semiconductor chip 26 directed upwards of FIG. 9(a). Like in FIG. 8(b), the lands 27 are exposed to the atmosphere and can be seen through the via holes 36. In FIG. 9(a), the base film member is directly located on the circuit board 55 without any bumps interposed. In this event, the resin mold 39 is brought into contact with the silver paste 65. Consequently, the base film member is in close contact with the circuit board 55.

On the other hand, the lands 27 or the inner leads 28 are directly bonded to the lands 61 on the circuit board 55 by the use of a bonding tool to form bonding portions 70. Such bonding portions can be formed by inserting the bonding tool into the via holes 36 and by bonding the lands 27 or the inner leads 28 to the lands 61 by a single point method. Accordingly, the bonding portions 70 can be seen through the via holes 36 of the base film sheet 35, as illustrated in FIG. 9(b).

With this structure, the second bumps 63 on the circuit board 55 include bumps which are thermally coupled through thermal via holes of the circuit board 55 to the silver paste 66 filled in the cavity portion 65. In order to improve a heat radiation characteristic of the semiconductor device, dummy bumps 63' may be included in the second bumps 63, as shown in FIG. 9(c).

At any rate, the semiconductor chip 26 is thermally coupled to the circuit board 55 through the silver paste 66. Therefore, heat is effectively radiated from the semiconductor chip 26 through the circuit board 55.

Figure 10:
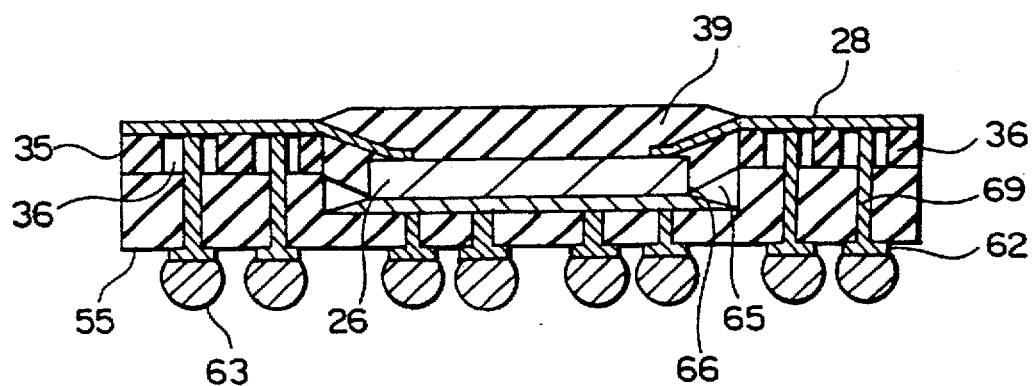
FIG. 10 is a sectional view of a semiconductor device according to an eighth embodiment of this invention.

Referring to FIG. 10, a semiconductor device according to an eighth embodiment of this invention is similar to that illustrated in FIG. 9(a) except that the back chip surface of the semiconductor chip 26 (FIG. 10) is brought into contact with the silver paste 66 filled in the cavity portion 65 formed in the circuit board 55. In this case, the front chip surface of the semiconductor chip 26 is directed upwards of FIG. 10 and covered with the resin mold 39, as shown in FIG. 10. In other words, the semiconductor chip 26 illustrated in FIG. 10 is reversed relative to that illustrated in FIG. 9 and mounted on the cavity portion 65 of the circuit board 55.

In the illustrated example, the lands 62 which are formed on a lower board surface of the circuit board 55 to mount the second bumps 63 and are extended through the circuit board 55 into the via holes 36 bored in the base film sheet 35. In other words, the lands 62 are projected into the via holes 36 in the form of electrode pins 69 which are electrically connected to the inner leads 28. In addition, the second bumps 63 include bumps which are thermally coupled to the silver paste 66 in the cavity portion 65, which serves to improve the heat radiation characteristic.

It is to be noted in connection with all embodiments that the via holes 36 have internal side surfaces no covered with any conduction materials.

While this invention has far been described in conjunction with several embodiments thereof, it will readily be possible for those skilled in the art to put this invention into practice in various other manners. For example, the circuit board 55 may include pins in lieu of the second bumps 63 illustrated in FIGS. 7 through 10. Thus, it is possible to improve electric and thermal characteristics and/or to increase a packing density by forming via holes in the base film sheet.

What is claimed is:

1. A semiconductor device, comprising:

a base film sheet which has a center region, a device hole in said center region, a peripheral region surrounding said center region, and a plurality of via hole bored on the peripheral region;

a semiconductor chip attached to said base film sheet in said device hole of said center region;

an electric connection member which is laid on said peripheral region to be electrically connected to said semiconductor chip, said electric connection member comprising a plurality of lands arranged on said peripheral portion of said base film sheet and located at the position of said plurality of said via holes, and a plurality of inner leads connected to said lands and said semiconductor chip;

an outer electrode member which has a portion positioned at said at said plurality of via holes and which is electrically connected to said electric connection member, said outer electrode member comprising a plurality of first bumps mounted on said lands and projected from said base film sheet; and a metal plate member electrically connected to said first bumps through said plurality of via holes, said metal plate member comprising a plate surface and a plurality of second bumps attached to said plate surfaces faced with said via holes of said base film sheet to be electrically connected to said first bumps through said via holes, said metal plate has a center area, a peripheral area which surrounds said center area on said plate surface, and a hole formed on said center area and covers the peripheral region of said base film sheet with said semiconductor chip left uncovered, said second bumps being formed on said peripheral area and projected towards said base film sheet.

2. A semiconductor device, comprising:

a base film sheet which has a center region, a device hole in said center region, a peripheral region surrounding said center region, and a plurality of via hole bored on the peripheral region;

a semiconductor chip attached to said base film sheet in said device hole of said center region;

an electric connection member which is laid on said peripheral region to be electrically connected to said semiconductor chip, said electric connection member comprising a plurality of lands arranged on said peripheral portion of said base film sheet and located at the position of said plurality of said via holes, and a plurality of inner leads connected to said lands and said semiconductor chip;

an outer electrode member which has a portion positioned at said at said plurality of via holes and which is electrically connected to said electric connection member, said outer electrode member comprising a plurality of first bumps mounted on said lands and projected from said base film sheet; and a metal plate member electrically connected to said first bumps through said plurality of via holes, said metal plate member comprising a plate surface and a plurality of second bumps attached to said plate surfaces faced with said via holes of said base film sheet to be electrically connected to said first bumps through said via holes, said metal plate has on the plate surface a center area, a peripheral area surrounding said center area, and a solder layer which is formed on said center area and which is brought into contact with said semiconductor chip, said second bumps being formed on said peripheral area and projected towards said base film sheet.

3. A semiconductor device as claimed in claim 2, wherein said metal plate has a plurality of through holes on said peripheral area while said second bumps are extended into said through holes.

4. A semiconductor device comprising:

a plurality of semiconductor units stacked to each other to be electrically connected to each other; and a metal plate member contacting an uppermost of said semiconductor units, wherein each of said semiconductor units comprises:

a base film sheet which has a center region, a peripheral region, and a plurality of via holes bored on the peripheral region;

a semiconductor chip attached to said base film sheet;

an electrical connection member which is laid on said peripheral region to be electrically connected to said semiconductor chip; and an outer electrode member which has a portion positioned at said via holes and which is electrically connected to said electrical connection member, said outer electrode member comprising a plurality of first bumps positioned at the via holes.

5. A semiconductor device as claimed in claim 4, wherein said base film sheet has a device hole on the center region while said semiconductor chip is located within said device hole.

6. A semiconductor device as claimed in claim 5, wherein said metal plate member comprises:

a metal plate having a plate surface; and a plurality of second bumps attached to said plate surface faced with said via holes of the uppermost one of the semiconductor units to be electrically connected to said first bumps through said via holes.

7. A semiconductor device as claimed in claim 6, wherein said via holes of the base film sheet in each semiconductor unit are buried by selected ones of the first bumps and the second bumps to be electrically connected to one another.

8. A semiconductor device as claimed in claim 7, wherein said metal plate has a center area, a peripheral area surrounding said center area, and a hole formed on the center area to cover the uppermost one of the semiconductor units by said peripheral area with the semiconductor chip left uncovered.

9. A semiconductor device comprising:

a base film sheet which has a center region, a peripheral region surrounding said center region, and a plurality of via holes bored on the peripheral region;

a semiconductor chip attached to said base film sheet;

an electric connection member which is laid on said peripheral region to be electrically connected to said semiconductor chip, said electric connection member comprising a plurality of first bumps located at positions of said via holes;

an outer electrode member which as a portion positioned at said plurality of via holes and which is electrically connected to said electric connection member;

a circuit board member attached to said electric connection member, said first bumps of said electric connection member projecting towards said circuit board member for mounting on said circuit board member, said circuit board member has first and second board surfaces opposite to each other;

a plurality of electrode members which are formed on said first board surface and which are brought into contact with said first bumps; and a plurality of second bumps which are formed on said second board surfaces and which are electrically connected to said first bumps.

10. A semiconductor device as claimed in claim 9, wherein each of the first bumps comprises a portion projected from said base film sheet and a portion buried in each of said via holes.

11. A semiconductor device as claimed in claim 9, wherein said circuit board comprises:

a first conductive layer which is included in said circuit board and which are electrically connected to particular ones of the first bumps and particular ones of the second bumps; and a second conductive layer which is included in said circuit board and which are isolated from said first conductive layer and electrically connected to specific ones of the first and the second bumps that are different from the particular ones of the first and the second bumps.

12. A semiconductor device as claimed in claim 9, wherein said first bumps are located on the via holes of the base film sheet with the via holes kept empty.

* * * * *